(12) United States Patent
Chen

(10) Patent No.: US 9,774,321 B1
(45) Date of Patent: Sep. 26, 2017

(54) ONE-DIRECTION CONDUCTION DEVICES

(71) Applicant: Quanta Computer Inc., Taoyuan (TW)

(72) Inventor: Sheng-Feng Chen, Taoyuan (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 0 days.

(21) Appl. No.: 15/341,116

(22) Filed: Nov. 2, 2016

(30) Foreign Application Priority Data

Aug. 19, 2016 (TW) .............................. 105126516 A

(51) Int. Cl.
*H03K 17/16* (2006.01)
*H02M 1/08* (2006.01)
*H02M 7/219* (2006.01)

(52) U.S. Cl.
CPC ............. *H03K 17/168* (2013.01); *H02M 1/08* (2013.01); *H02M 7/219* (2013.01); *H03K 2217/0036* (2013.01)

(58) Field of Classification Search
CPC ................................ H02M 1/08; H02M 7/219
USPC .......................... 327/389, 374, 387, 403, 427
See application file for complete search history.

(56) References Cited

U.S. PATENT DOCUMENTS

| | | | | |
|---|---|---|---|---|
| 6,060,943 A * | 5/2000 | Jansen | ................. | H03K 17/063 327/493 |
| 6,469,564 B1 * | 10/2002 | Jansen | ..................... | G06G 7/62 327/365 |
| 7,190,207 B2 * | 3/2007 | Chen | .................... | H03K 17/063 327/365 |
| 8,207,779 B2 * | 6/2012 | Hu | ....................... | H03K 17/145 327/108 |
| 9,621,020 B2 * | 4/2017 | Hu | .......................... | H02M 1/08 |
| 2005/0253642 A1 * | 11/2005 | Chen | .................... | H03K 17/063 327/427 |
| 2008/0030263 A1 * | 2/2008 | Frederick | .................. | H02J 1/10 327/541 |
| 2009/0285001 A1 * | 11/2009 | Hu | ......................... | H02M 1/08 363/126 |

* cited by examiner

*Primary Examiner* — Ryan Jager
(74) *Attorney, Agent, or Firm* — McClure, Qualey & Rodack, LLP

(57) ABSTRACT

A one-direction conduction device includes a first transistor and a driving circuit. The first transistor has a control terminal coupled to a first node, and input and output terminals respectively coupled to input and output electrode terminals of the one-direction conduction device. In the driving circuit, a switch circuit is coupled to the input electrode terminal and a second node. A second transistor has a base and a collector both coupled to a third node, and an emitter coupled to the second node. A first resistor is coupled to the third node and ground. A third transistor has a base coupled to the third node, an emitter coupled to the output electrode terminal, and a collector coupled to the first node. The second resistor is coupled between the first node and the ground. The switch circuit breaks off a reverse leakage current path of the one-direction conduction device.

10 Claims, 5 Drawing Sheets

ONE-DIRECTION CONDUCTION DEVICES

CROSS REFERENCE TO RELATED APPLICATIONS

This Application claims priority of Taiwan Patent Application No. 105126516, filed on Aug. 19, 2016, the entirety of which is incorporated by reference herein.

BACKGROUND OF THE INVENTION

Field of the Invention

The invention is related to a memory, and more particularly to a one-direction conduction device, and, more particularly, to a one-direction conduction device with less reverse leakage current.

Description of the Related Art

In electronic circuits, diodes are common electronic components. Due to their features of one-direction conduction, diodes can be applied in a power input terminal of a power supply system for preventing the current of a battery in a powered device from flowing outward, and they can also be applied in a power supply system with dual power inputs for preventing the current of a power supply terminal from flowing to another power supply system. However, when a diode is in a reverse-bias state, the reverse current flowing from the cathode to the anode will cause unnecessary power consumption, which degrades power-usage efficiency of the entire circuit.

BRIEF SUMMARY OF THE INVENTION

An exemplary embodiment of a one-direction conduction device is provided. The one-direction conduction device comprises a first transistor and a driving circuit. The first transistor has a control terminal coupled to a first node, an input terminal coupled to an input electrode terminal of the one-direction conduction device, and an output terminal coupled to an output electrode terminal of the one-direction conduction device. The driving circuit is coupled to the first transistor. The driving circuit comprises a first switch circuit, a second transistor, a first resistor, a third transistor, and a second resistor. The first switch circuit is coupled to the input electrode terminal and a second node. The second transistor has a base coupled to a third node, an emitter coupled to the second node, and a collector coupled to the third node. The first resistor has a first terminal coupled to the third node through the first switch circuit and a second terminal coupled to a ground. The third transistor has a base coupled to the third node, an emitter coupled to the output electrode terminal, and a collector coupled to the first node. The second resistor has a first terminal coupled to the first node and a second terminal coupled to the ground. The first switch circuit determines whether to break off a reverse leakage current path of the one-direction conduction device or not according to a voltage at the first terminal of the first resistor and a voltage at the second node.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
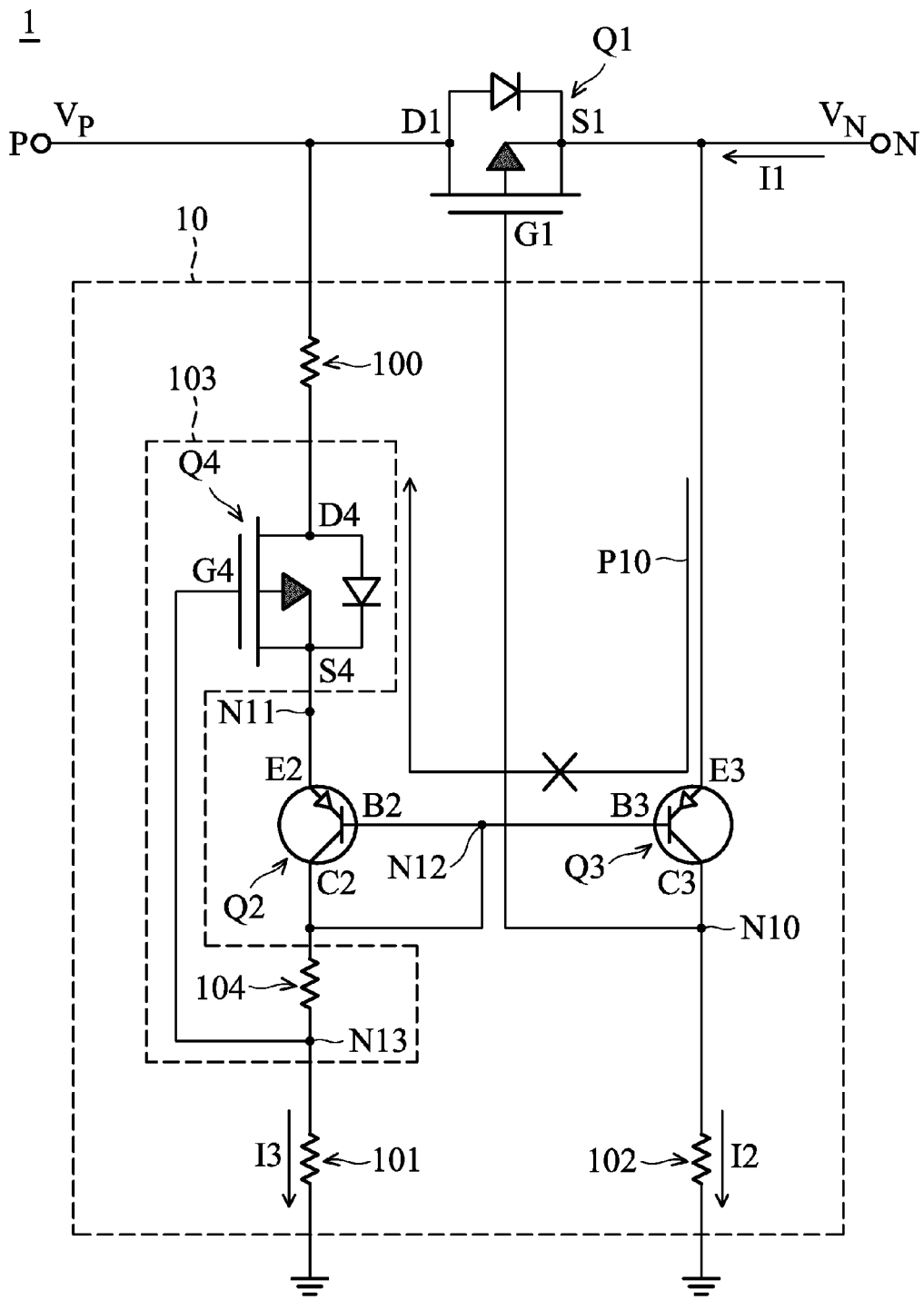
FIG. 1 is schematic chart showing a structure of a one-direction conduction and an operation thereof when the one-direction conduction device is in a reverse-bias state in accordance with an exemplary embodiment.

The following description is of the best-contemplated mode of carrying out the invention. This description is made for the purpose of illustrating the general principles of the invention and should not be taken in a limiting sense. The scope of the invention is best determined by reference to the appended claims.

Various exemplary embodiments of the present invention, features and aspects will be described with reference to the accompanying drawings. The elements with identical or similar functions are designated by the same reference numerals. Although the drawings illustrate various aspects of the embodiments, the drawings are not necessarily drawn to scale unless otherwise indicated.

FIG. 1 shows an exemplary embodiment of a one-direction conduction device. Referring to FIG. 1, a one-direction conduction device 1 comprises a metal-oxide-semiconductor transistor Q1 and a driving circuit 10. Through controlling the metal-oxide semiconductor transistor Q1 by the driving circuit 10 for, the one-direction conduction device 1 achieves one-direction conduction with extremely low forward bias. The driving circuit 10 comprises PNP bipolar junction transistors (BJTs) Q2 and Q3, resistors 100-102, and a switch circuit 103. In the embodiment, the switch circuit 103 comprises a P-type metal-oxide semiconductor (PMOS) transistor Q4 and a resistor 104. The metal-oxide-semiconductor transistor Q1 is a PMOS transistor. The drain (referred to as "input terminal") D1 and the source (referred to as "output terminal") S1 of the PMOS transistor Q1 are coupled to an input electrode terminal (anode) P and the output electrode terminal (cathode) N respectively, and the gate (referred to as "control terminal") G1 thereof is coupled to the driving circuit 10 at a node N10. The resistor 100 is coupled between the input electrode terminal P and the drain (referred to as "input terminal") D4 of the PMOS transistor Q4. The gate (referred to as "control terminal") G4 of the transistor Q4 within the switch circuit 103 is coupled to the node N13, and the source (referred to as "output terminal") S4 thereof is coupled to the node N11. The base B2 and collector C2 of the transistor Q2 are coupled to the node N12, and the emitter E2 thereof is coupled to the node N11. The first terminal of the resistor 104 within the switch circuit 103 is coupled to the node N12, and the second thereof is coupled to the node N13. The first terminal of the resistor 101 is coupled to the node N13, and the second thereof is coupled to a ground terminal. According to the connection relationship between the resistor 101 and the switch circuit 103, the first terminal of the resistor 101 is coupled to the node N12 through the resistor 104 of the switch circuit 103. The base B3 of the transistor Q3 is coupled to the base B2 and collector C2 of the transistor Q2 at the node N12, the emitter E3 is coupled to the output electrode terminal N, and the collector C3 is coupled to the gate G1 of the PMOS transistor Q1 at the node N10. The first terminal of the resistor 102 is coupled to the node N10, and the second terminal thereof is coupled to the ground terminal. Based on the connection structure of the transistors Q2 and Q3, the transistors Q2 and Q3 form a BJT amplifier.

In the following, the operation of the one-direction conduction device 1 will be described according to an exemplary embodiment.

Referring to FIG. 1, when the one-direction conduction device 1 is in a reverse-bias state (that is, when the voltage $V_N$ of the output electrode terminal N is higher than the voltage $V_P$ of the input electrode terminal P), the transistor Q3 is turned on, and the node N10 coupled to the collector C3 of the transistor Q3 is at a high voltage level, so that the PMOS transistor Q1 is fully turned off, that is the one-direction conduction device 1 is turned off. Assume that the voltage $V_N$ of the output electrode terminal N is 20 volts (V), the gate voltage $V_{G4}$ and the source voltage $V_{s4}$ of the PMOS transistor Q4 are:

$$V_{G4}=(V_N-V_{BE3})/(R104+R101*R101)$$

$$V_{S4}=V_N-V_{BE3}-V_{EB2}$$

$V_{BE3}$ represents the forward bias of the transistor Q3 (that is, the base-emitter voltage of the transistor Q3) which is approximately equal to 0.6V. $V_{EB2}$ represents the reverse bias of the transistor Q2 (that is, the emitter-base voltage of the transistor Q2) which is approximately equal to 6V. R104 represents the resistance of the resistor 104, which is equal to, for example, 240 K ohm. R101 represents the resistance of the resistor 101, which is equal to, for example, 750 K ohm. Thus, the gate voltage $V_{G4}$ (that is, the voltage at the node N13) and the source voltage $V_{s4}$ (that is, the voltage at the node N11) of the PMOS transistor Q4 are:

$$V_{G4}=(V_N-V_{BE3})/(R104+R101*R101)$$

$$=(20V-0.6V)/(240 K+750 K*750 K)$$

$$=14.7V$$

$$V_{S4}=V_N-V_{BE3}-V_{EB2}$$

$$=20V-0.6V-6V$$

$$=13.4V$$

The gate-source voltage $V_{GS4}$ of the PMOS transistor Q4 is:

$$V_{GS4}=V_{G4}-V_{S4}=14.7V-13.4V=1.3V$$

According to the gate-source voltage $V_{GS4}$ with a positive value, the PMOS transistor Q4 is turned off. Accordingly, when the one-direction conduction device 1 is in the reverse-bias state, the reverse leakage current path P10 which is formed through the transistors Q2 and Q3 between the output electrode terminal N and the input electrode terminal P is broken off by the turned-off PMOS transistor Q4. According to the above description, the first terminal of the resistor 101 is coupled to the node N13. Thus, when the one-direction conduction device 1 is in the reverse-bias state, the switch circuit 103 determines whether to break off the reverse leakage current path according to the voltage (that is, the gate voltage $V_{G4}$) at the first terminal of the resistor 101 (that is, the node N13) and the voltage (that is, the source voltage $V_{S4}$) at the node N11. When the difference between the voltage at the first terminal of the resistor 101 and the voltage at the node N11 is higher than 0V, the PMOS transistor Q4 is turned off to break off the reverse leakage current path, so that the reverse leakage current approximates zero in the reverse bias state.

When the voltage $V_P$ of the input electrode terminal P increases gradually and reaches 19V, the source voltage $V_{s4}$ of the PMOS transistor Q4 approaches 19V through the resistor 100 and the body diode of the PMOS transistor Q4. At this time, the gate voltage $V_{G4}$ of the PMOS transistor Q4 (that is, the voltage at the node N13) is still equal to 14.7V. Thus, the gate-source voltage $V_{GS4}$ of the PMOS transistor Q4 is equal to:

$$V_{GS4}=V_{G4}-V_{S4}=14.7V-19V=-4.3V$$

Based on the gate-source voltage $V_{GS4}$ with a negative value, the PMOS transistor Q4 is turned on. Thus, when before the one-direction conduction device 1 enters the forward-bias state, the PMOS transistor is already turned on, so that the one-direction conduction device 1 can work normally in the forward-bias state. The detailed operation of the one-direction conduction device 1 in the forward-bias state will be explained in the following.

Figure 2:
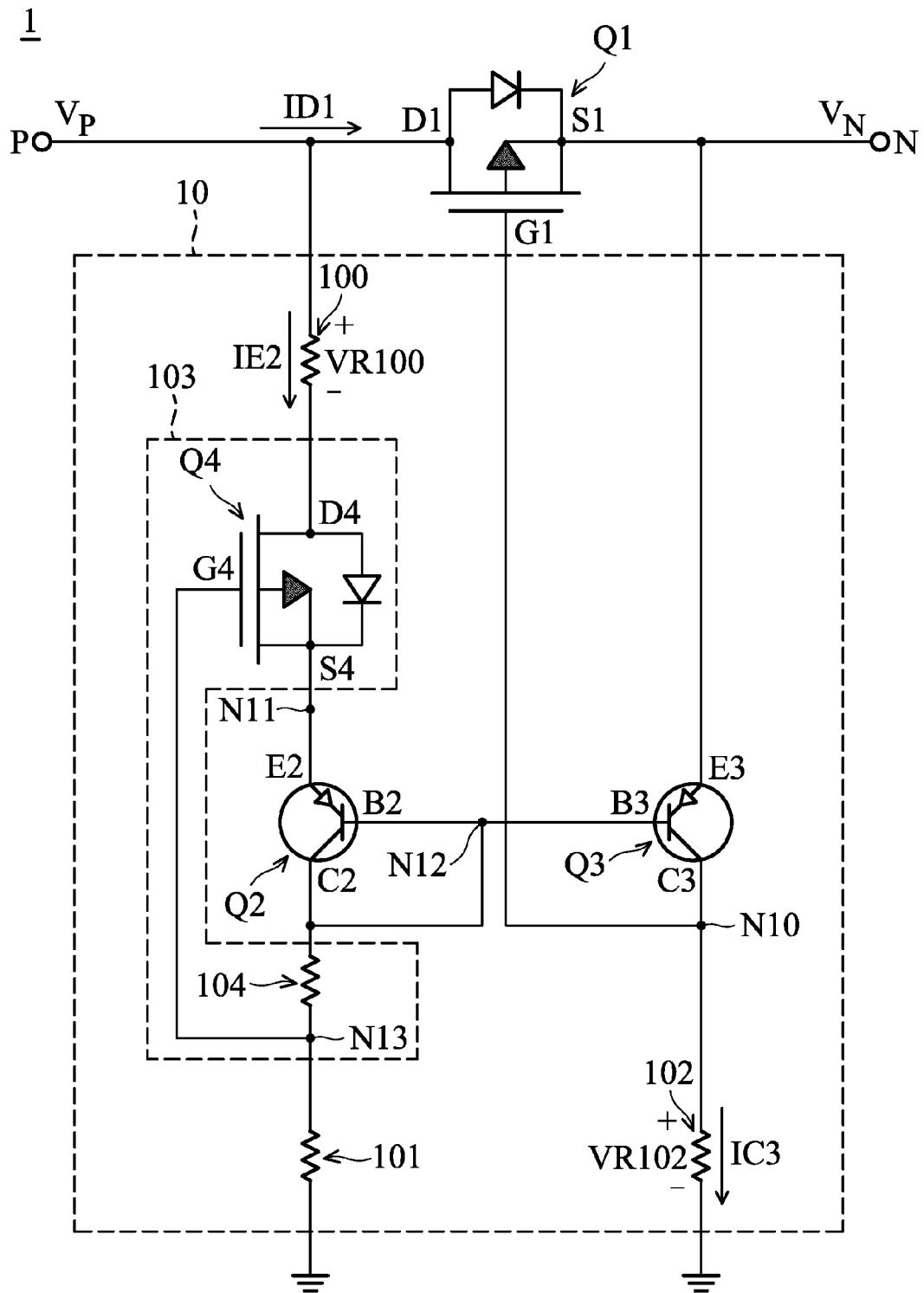
FIG. 2 is schematic chart showing a structure of a one-direction conduction and an operation thereof when the one-direction conduction device is in a forward-bias state in accordance with an exemplary embodiment.

Referring to FIG. 2, when the one-direction conduction device 1 is in the forward-bias state (that is, the voltage $V_P$ of the input electrode terminal P is higher than the voltage $V_N$ of the input electrode terminal N), since the PMOS transistor Q4 has been turned on, a quiescent current IE2 flows through the resistor 100 and the transistor Q2, so that, there is voltage VR100 across the two terminals of the resistor 100. In the embodiment, the value of the voltage VR100 is preferably equal to tens of millivolts (mV). When the voltage $V_P$ of the input electrode terminal P increases to a level where the voltage difference between the input electrode terminal P and the output electrode terminal N is higher than the voltage VR100, the voltage of the emitter E2 of the transistor Q2 increases with the increase of the voltage $V_P$ of the input electrode terminal P. Due to the resistance of the resistor 100 (for example, being 1 K ohm), the quiescent current IE2 almost keeps constant, so that the emitter-base voltage $V_{EB2}$ of the transistor $Q_2$ almost keeps constant. Since the voltage of the emitter E2 of the transistor Q2 increases with the increase of the voltage $V_P$ of the input electrode terminal P, the voltage of the base B2 of the transistor Q2 increases with the increment of the voltage of the emitter E2 of the transistor Q2. As described above, the base B3 of the transistor Q3 is coupled to the base B2 of the transistor Q2. Thus, the voltage of the base B3 of the transistor Q3 increases with the increment of the voltage of base B2 of the transistor Q2. However, since the voltage $V_N$ of the output electrode terminal N keeps constant, the voltage of the emitter E3 of the transistor Q3 also keeps constant, so that the emitter-base $V_{EB3}$ of the transistor Q3 decreases. Accordingly, the current IC3 flowing through the corrector C3 of the transistor Q3 decreases, and the voltage VR102 across the resistor 102 decreases, which results in the decrease of the voltage of the collector C3 of the transistor Q3. When the voltage of the collector C3 of the transistor Q3 decreases to a level where the source-gate voltage $V_{sm}$ of the PMOS transistor Q1 is higher than the absolute value of the threshold Vth of the PMOS transistor Q1, the PMOS transistor Q1 is turned on, and a forward current ID1 flows to the output electrode terminal N from the input electrode terminal P.

According to the above embodiment, when the one-direction conduction device 12 operates in the reverse-bias state, the switch circuit 103 is turned on to break off the reverse leakage current path, so that the reverse leakage current approximates zero, thereby reducing unnecessary power consumption. Moreover, when the voltage $V_P$ of the input electrode terminal P gradually increases, the switch circuit 103 is turned on before the one-direction conduction device 1 enters a forward-bias state, so that the one-direction conduction device 1 can operate normally in the forward-bias state. Thus, based on the disposition and operation of the switch circuit 103, a circuit using the one-direction conduction device 1 can have high power-usage efficiency.

Figure 3:
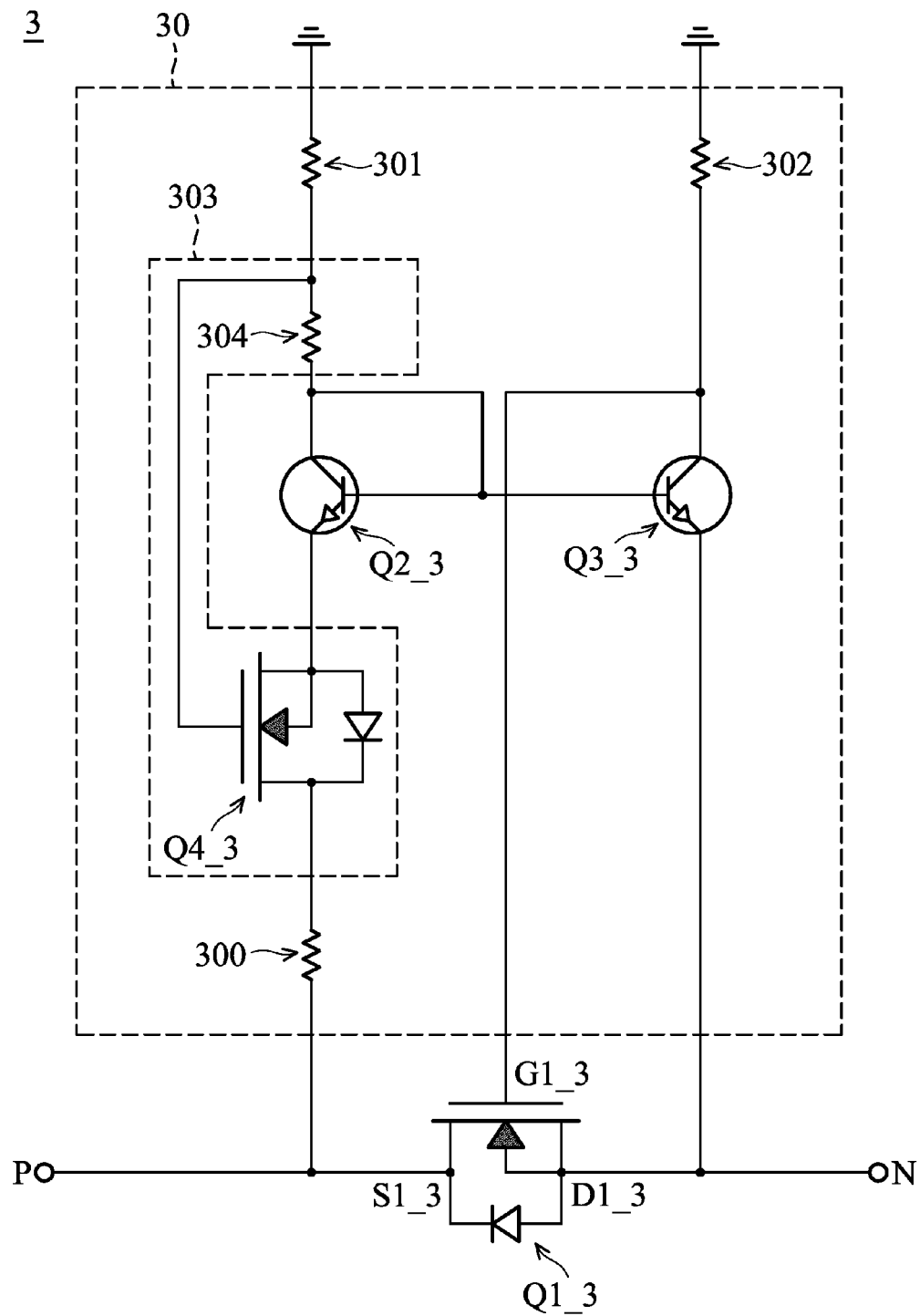
FIG. 3 shows another exemplary embodiment of a one-direction conduction device.

FIG. 3 shows an exemplary embodiment of a one-direction conduction device 3. Referring to FIG. 3, the one-direction conduction device 3 comprises N-type metal-oxide semiconductor (NMOS) transistor Q1_3 and a driving circuit 30. The driving circuit 30 comprises NPN bipolar junction transistors (BJTs) Q2_3 and Q3_3, resistors 300-302, and switch circuit 303. The switch circuit 303 comprises NMOS transistor Q4_3 and a resistor 304. The source S1_3 and the drain D1_3 of the NMOS transistor Q1_3 are coupled to an input electrode terminal P and the output electrode terminal N of the one-direction conduction device 3 respectively, and the gate G1_3 thereof is coupled to the driving circuit 30. The circuit structure and operation of the one-direction conduction device 30 are similar to those of the one-direction conduction device 1 of FIG. 1. The difference between the one-direction conduction device 3 and the one-direction conduction device 1 of FIG. 1 is that the NMOS transistors Q1_3 and Q4_3 replace the NMOS transistors Q1 and Q4 of the one-direction conduction device 1 respectively and that NPN bipolar junction transistors Q2_3 and Q3_3 replace the PNP bipolar junction transistors Q2 and Q3 of the one-direction conduction device 1 respectively for forming the one-direction conduction device 3 of FIG. 3. Thus, for details of the operation of the one-direction conduction device 3, refer to the above description of the one-direction conduction device 1 of FIG. 1, and the description related to the operation of the one-direction conduction device 3 is omitted here.

Referring to FIG. 1, in some embodiments, when the one-direction conduction device 1 is in the reverse-bias state, the reverse leakage current approximates zero. However, there may be a quiescent current I1 flowing from the output electrode terminal N. As shown in FIG. 1, the quiescent current I1 is composed of the current I3 flowing through the resistors 101 and 104 and the current I2 flowing through the resistor 102. Assume that the voltage $V_N$ of the output electrode terminal N is 20V, then, the currents I2 and I3 are represented as:

$$I2=(V_N-V_{CE3})/R102$$

$$I3=(V_N-V_{BE3})/(R104+R101)$$

wherein $V_{CE3}$ represents the collector-emitter voltage of the transistor Q3, which is approximately equal to 0.2V, and R102 represents the resistance of the resistor 102, which is equal to, for example, 1 M ohm (1000 K ohm). Thus, the currents I2 and I3 are:

$$I2=(V_N-V_{CE3})/R102$$

$$=(20-0.2)/1000\ K$$

$$=19.8\ \mu A\ (microampere)$$

$$I3=(V_N-V_{BE3})/(R104+R101)$$

$$=(20-0.6)/(240\ K+750\ K)$$

$$=19.6\ \mu A$$

The quiescent current I1 is equal to:

$$I1=I2+I3=19.8\ \mu A+19.6\ \mu A=39.4\ \mu A$$

Thus, in the reserve-bias state, the quiescent current I1 may be present, which results in power consumption.

Figure 4:
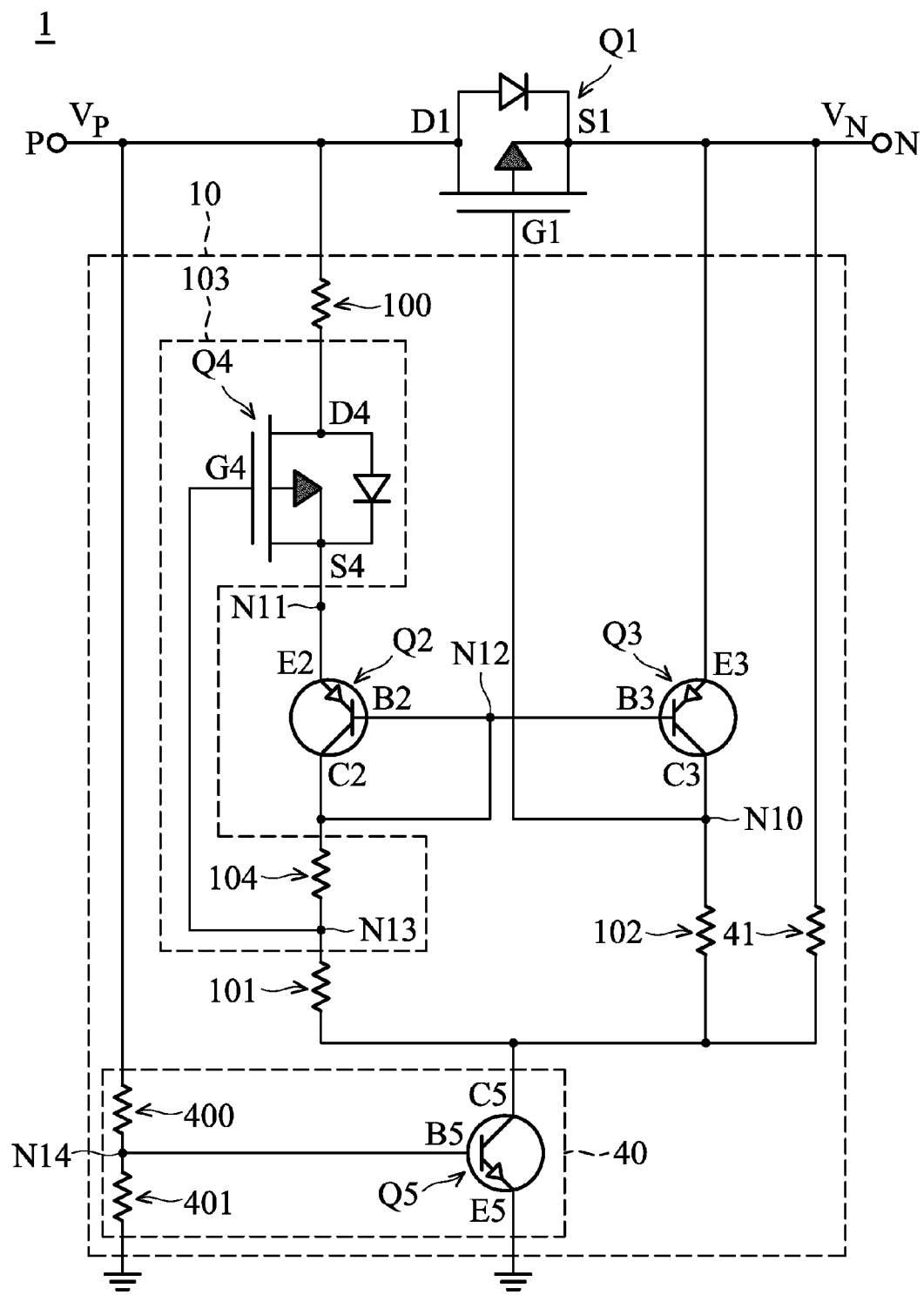
FIG. 4 shows another exemplary embodiment of a one-direction conduction device.

According to another embodiment, as shown in FIG. 4, the driving circuit 10 further comprises a switch circuit 40 and a resistor 41 for breaking off a quiescent current path between the output electrode path N and the ground when the one-direction conduction device 1 is in the reverse-bias state. Referring to FIG. 4, the switch circuit 40 comprises resistors 400 and 401 and an NPN bipolar junction transistor Q5. The resistor 400 is coupled between the input electrode terminal P and the node N14. The resistor 401 is coupled between the node N14 and the ground. The base B5 (also referred to as "control terminal") of the transistor Q5 is coupled to the node N14, the collector C5 (also referred to as "input terminal") thereof is coupled to the second terminals of the resistors 101 and 102, and the emitter E5 (also referred to as "output terminal") thereof is coupled to the ground. The resistor 41 is coupled to the output electrode terminal N and the second terminal of the resistor 102.

When the one-direction conduction device 1 is in a reverse-bias state, the voltage $V_P$ of the input electrode terminal P is at a low level or 0V since the reverse leakage current path is broken off by the switch circuit 103. At this time, the voltage at the node N14 is at a low level to turn off the transistor Q5. Accordingly, the currents I2 and I3 shown in FIG. 1 are not generated any more, thereby breaking off the quiescent current path between the output electrode path N and the ground. In order to prevent the gate G1 of the PMOS transistor Q1 from floating when the transistor Q5 is turned off, the resistor 41 is used to make the gate-source voltage $V_{GS1}$ of the PMOS transistor Q1 approximately equal to 0V, thereby continuously turning off the PMOS transistor Q1.

When the voltage $V_P$ of the input electrode terminal P starts rising, the transistor Q5 is turned on once the voltage at the node N14 is at a high level. Then, the one-direction conduction device 1 can work normally in the forward-bias state.

According to the above description, the switch circuit 40 can determine whether to break off the quiescent current path between the output electrode path N and the ground or not depending on the voltage $V_P$ of the input electrode terminal P. When the voltage $V_P$ of the input electrode terminal P is at a low level or 0V (that is, when the one-direction conduction device 1 is the reverse-bias state), the switch circuit 40 can break off the quiescent current path between the output electrode path N and the ground, thereby reducing power consumption.

In the embodiment of FIG. 4, the transistor Q5 can be implemented by an NMOS transistor. In the case, the gate (also referred to as "control terminal") of the NMOS transistor is coupled to the node N14, the drain (also referred to as "input terminal") thereof is coupled to the second terminals of the resistors 101 and 102, and the source (also referred to as "output terminal") is coupled to the ground.

Figure 5:
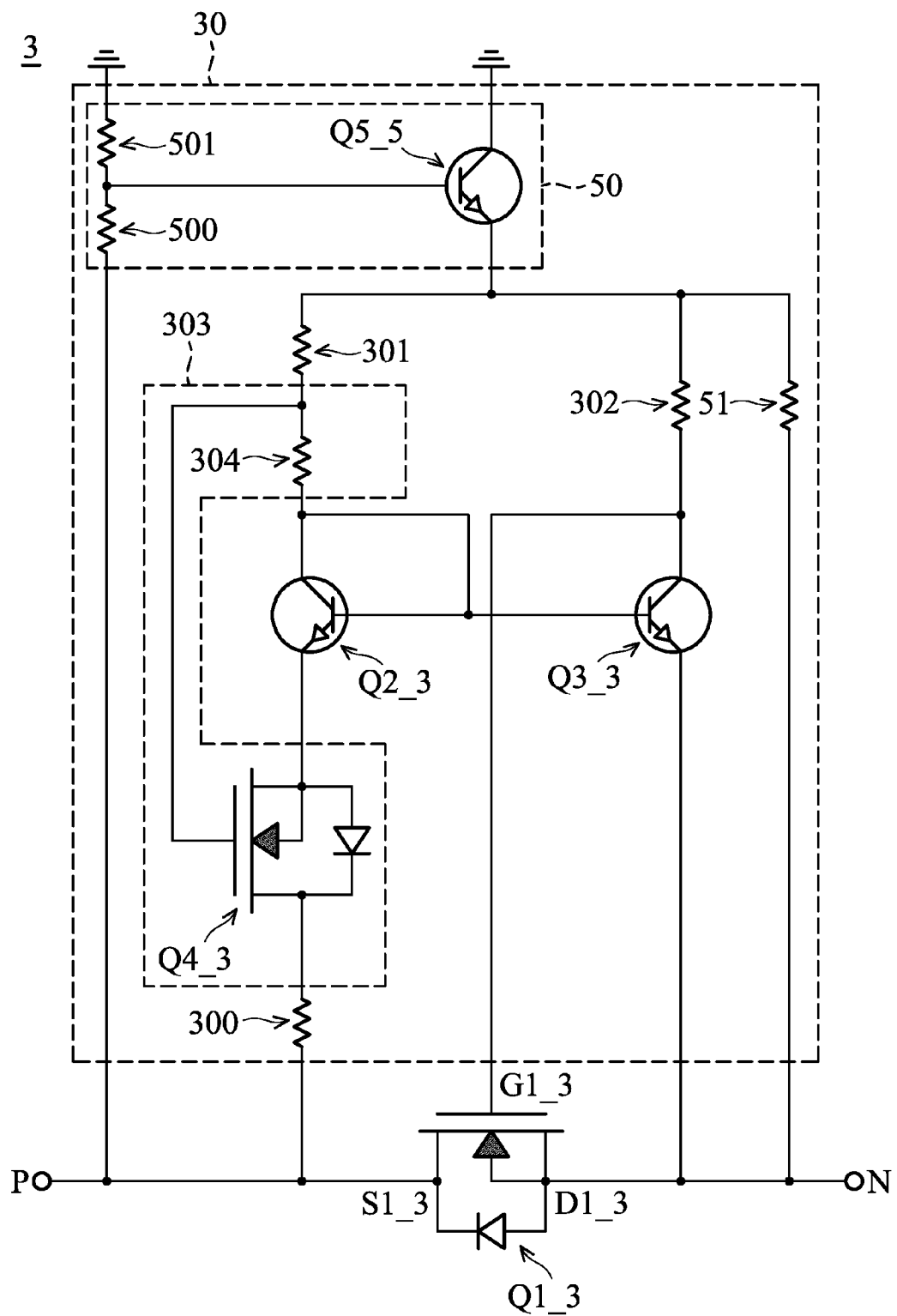
FIG. 5 shows another exemplary embodiment of a one-direction conduction device.

The one-direction conduction device 3 can comprise a switch circuit 50 and a resistor 51, as shown in FIG. 5, for breaking off a quiescent current path between the output electrode path N and the ground when the one-direction conduction device 1 is in the reverse-bias state. The switch circuit 50 comprises resistors 500 and 501 and an NPN bipolar junction transistor Q5_5. The circuit structures and operations of the switch circuit 50 and the resistor 51 are similar to those of the switch circuit 40 and the resistor 41 of FIG. 4. The difference between the switch circuit 50 and the switch circuit 40 of FIG. 4 is that PNP bipolar junction transistor Q5_5 replaces the NPN bipolar junction transistor Q5 for forming the switch circuit 50 of FIG. 5. Thus, for details of the operation of the switch circuit 50, refer to the above description of the switch circuit 40 of FIG. 4, and the description related to the operation of the switch circuit 50 is omitted here.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A one-direction conduction device comprising:
   a first transistor having a control terminal coupled to a first node, an input terminal coupled to an input electrode terminal of the one-direction conduction device, and an output terminal coupled to an output electrode terminal of the one-direction conduction device; and
   a driving circuit, coupled to the first transistor, comprising:
      a first switch circuit coupled to the input electrode terminal and a second node;
      a second transistor having a base coupled to a third node, an emitter coupled to the second node, and a collector coupled to the third node;
      a first resistor having a first terminal coupled to the third node through the first switch circuit and a second terminal coupled to a ground;
      a third transistor having a base coupled to the third node, an emitter coupled to the output electrode terminal, and a collector coupled to the first node; and
      a second resistor having a first terminal coupled to the first node and a second terminal coupled to the ground,
   wherein the first switch circuit determines whether to break off a reverse leakage current path of the one-direction conduction device or not according to a voltage at the first terminal of the first resistor and a voltage at the second node.

2. The one-direction conduction device as claimed in claim 1, wherein the first switch circuit comprises
   a fourth transistor having a control terminal coupled to a fourth node, an input terminal coupled to the input electrode terminal, and an output terminal coupled to the second node; and
   a third resistor having a first terminal coupled to the third node and a second terminal coupled to the fourth node,
   wherein the first terminal of the first resistor is coupled to the fourth node.

3. The one-direction conduction device as claimed in claim 2, wherein the driving circuit further comprises:
   a second switch circuit coupled to the second terminals of the first and second resistors and the ground,
   wherein the second circuit detects a voltage of the input electrode terminal and determines whether to break off a quiescent current of the one-direction conduction device or not according to the voltage of the input electrode terminal.

4. The one-direction conduction device as claimed in claim 3, wherein driving circuit further comprises:
   a fourth resistor coupled between the output electrode node and the second terminal of the second resistor.

5. The one-direction conduction device as claimed in claim 3, wherein the second switch circuit comprises:
   a fourth resistor coupled between the input electrode terminal and a fifth node;
   a fifth resistor coupled between the fifth node and the ground; and
   a fifth transistor having a control terminal coupled to the fifth node, an input terminal coupled to the second terminals of the first and second resistors, and an output terminal coupled to the ground.

6. The one-direction conduction device as claimed in claim 5, wherein the fifth transistor is an N-type metal-oxide semiconductor transistor, and a gate, a drain, and a source of the N-type metal-oxide semiconductor transistor correspond to the control terminal, the input terminal, and the output terminal of the fifth transistor respectively.

7. The one-direction conduction device as claimed in claim 5, wherein the fifth transistor is an NPN bipolar junction transistor, and a base, a collector, and an emitter of the NPN bipolar junction transistor correspond to the control terminal, the input terminal, and the output terminal of the fifth transistor, respectively.

8. The one-direction conduction device as claimed in claim 1, wherein the first transistor is a P-type metal-oxide semiconductor transistor, and the second and third transistors are PNP bipolar junction transistors.

9. The one-direction conduction device as claimed in claim 1, wherein the first transistor is an N-type metal-oxide semiconductor transistor, and the second and third transistors are NPN bipolar junction transistors.

10. The one-direction conduction device as claimed in claim 1 further comprising:
    a third resistor coupled between the input electrode terminal and the first switch circuit.

* * * * *